United States Patent
Bradt

[19]

[11] Patent Number: 5,909,358
[45] Date of Patent: Jun. 1, 1999

[54] SNAP-LOCK HEAT SINK CLIP

[75] Inventor: Douglas H. Bradt, Elkhart, Ind.

[73] Assignee: Todd Engineering Sales, Inc., Elkhart, Ind.

[21] Appl. No.: 08/980,500

[22] Filed: Nov. 26, 1997

[51] Int. Cl.$^6$ .................................................. H05K 7/20
[52] U.S. Cl. ........................... 361/707; 257/726; 361/690; 361/710; 361/715
[58] Field of Search .................................... 257/718–719; 361/688, 690, 704, 707, 709–710, 715–722

[56] References Cited

U.S. PATENT DOCUMENTS

| | | | |
|---|---|---|---|
| 3,572,428 | 3/1971 | Monaco | 165/80 |
| 4,712,159 | 12/1987 | Clemens | 361/386 |
| 4,745,456 | 5/1988 | Clemens | 357/79 |
| 5,077,638 | 12/1991 | Andersson et al. | 361/710 |
| 5,184,281 | 2/1993 | Samarov et al. | 361/386 |
| 5,327,324 | 7/1994 | Roth | 361/710 |
| 5,329,426 | 7/1994 | Villani | 361/719 |
| 5,343,362 | 8/1994 | Solberg | 361/710 |
| 5,371,652 | 12/1994 | Clemens et al. | 361/704 |
| 5,461,541 | 10/1995 | Wentland, Jr. et al. | 361/707 |
| 5,466,970 | 11/1995 | Smithers | 257/719 |
| 5,521,439 | 5/1996 | Casati et al. | 257/718 |
| 5,521,792 | 5/1996 | Pleitz et al. | 361/690 |
| 5,526,232 | 6/1996 | Kolberg et al. | 361/715 |
| 5,570,271 | 10/1996 | Lavochkin | 361/704 |
| 5,581,442 | 12/1996 | Morasas | 361/704 |
| 5,650,913 | 7/1997 | Kochanski | 361/704 |

FOREIGN PATENT DOCUMENTS

| | | | |
|---|---|---|---|
| 3331207 | 3/1985 | Germany | 361/709 |

*Primary Examiner*—Gregory Thompson
*Attorney, Agent, or Firm*—Baker & Daniels

[57] ABSTRACT

The present invention involves a heat sink clip which engages a slot of a heat sink to press a power component into a heat sink of an electronic module, such as a power converter circuit for a vehicle. A power converter module for a vehicle comprises a casing having at least one heat sink with a plurality of fins, power converter circuitry disposed within the casing and including at least one power component; and a clip for pressing the power component into the heat sink. The clip has a first end engaging a slot of the casing and a second end extending from the first end with a resilient biasing that presses the power component into thermal contact with the heat sink. The casing slot includes a lip which retains the clip within the slot, and a sloped surface which facilitates entry of the clip. The clip has a generally L-shaped configuration for engaging the slot, with a corner that abuts a lip of the casing slot to retain the corner within the slot. The clip also includes an end flange for engaging the slot in an interference fit. A thermally conductive, electrically insulating layer is disposed between the power component and the heat sink, and the clip includes an articulated portion extending beyond said power component so that only the clip second end contacts the power component. The clip is made of a metallic material.

18 Claims, 2 Drawing Sheets

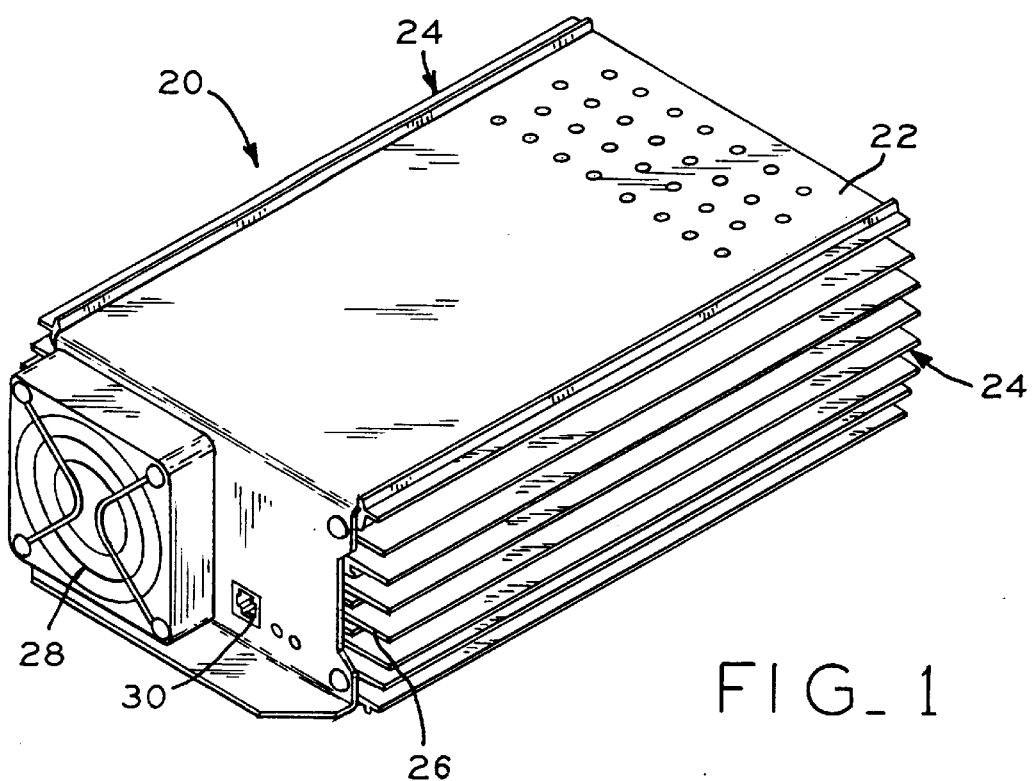
FIG_1
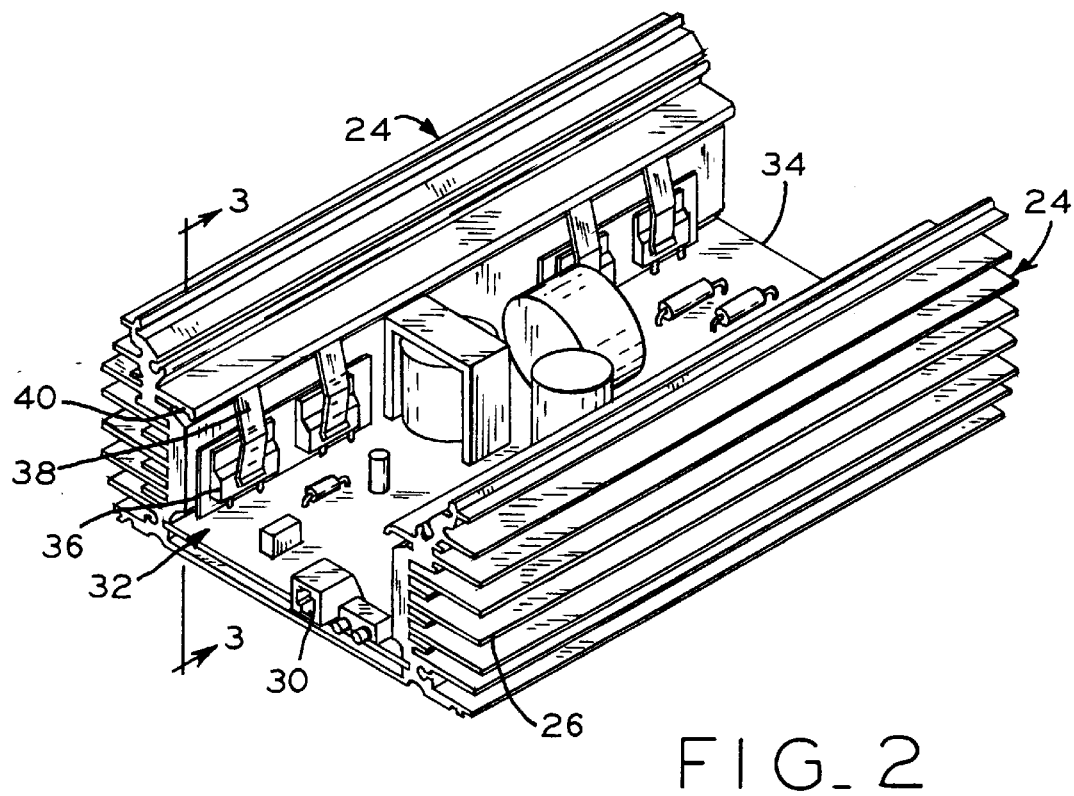
FIG_2

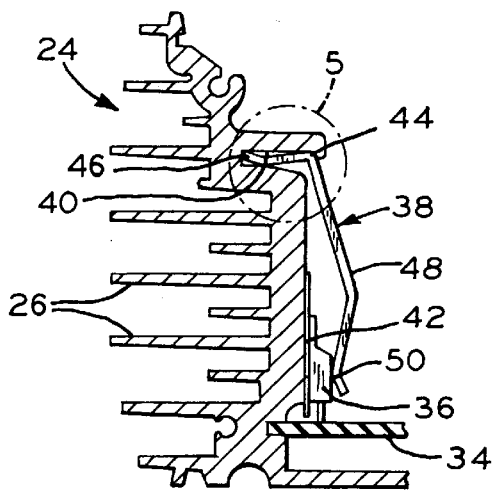
FIG_3
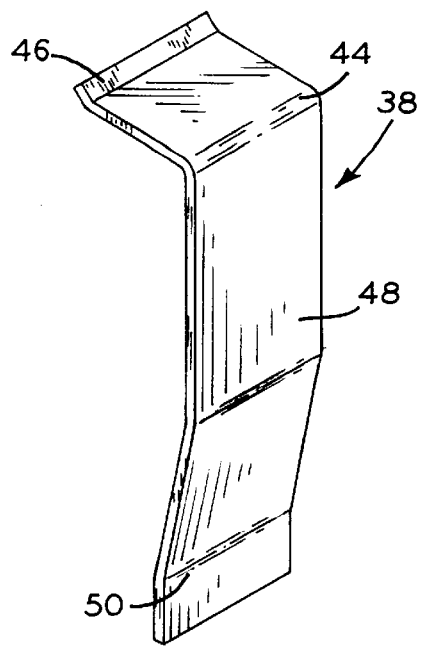
FIG_4
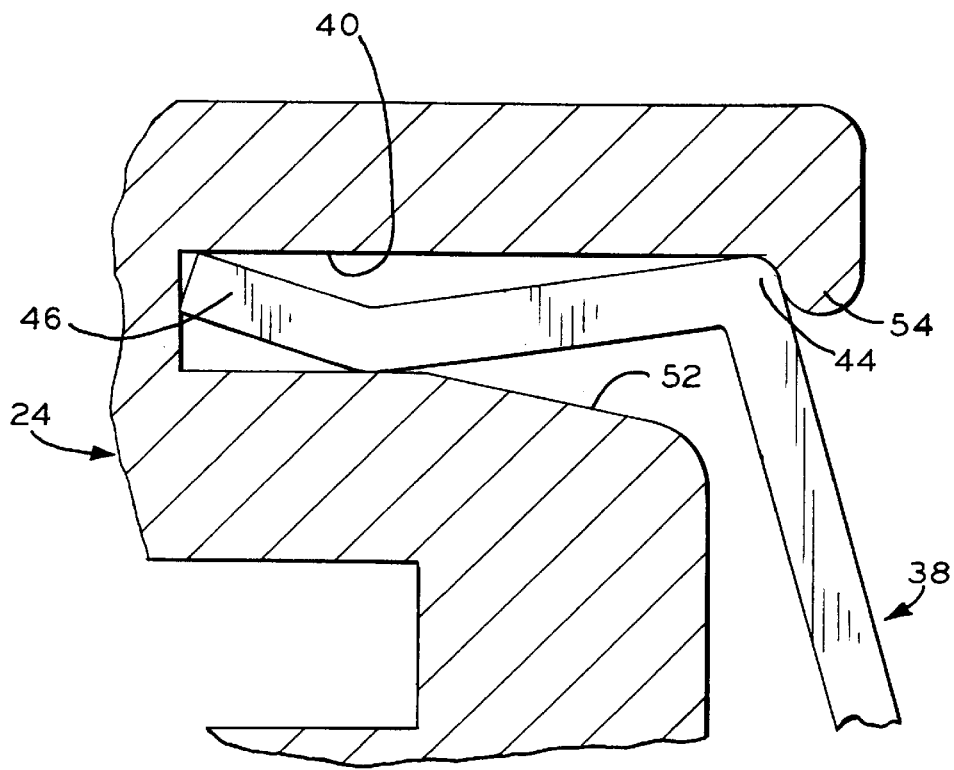
FIG_5

SNAP-LOCK HEAT SINK CLIP

BACKGROUND OF THE INVENTION

1. Field of the Invention

The invention generally relates to heat sinks for electronic circuits. More specifically, the field of the invention is that of attachment arrangements for maintaining thermal connection between electronic circuitry and heat sinks such as in power transformers and amplifier circuits for automobiles and other vehicles and other applications.

2. Description of the Related Art

In conventional vehicle power converters, such as those transformers and amplifier circuits for automobiles and other vehicles, the power transistors and rectifiers are used to scale down AC line voltage to suitable 12 volt DC currents. As a result of this step down transformer circuitry, the power transistors and rectifiers used in the circuit generate substantial amounts of heat. Conventionally, the casings of these units are built with heat sinks, typically on the lateral walls, so that the heat generated by the electrical components can be dissipated. Because of the space limitations in the vehicles, these casings are configured to minimize the amount of space occupied, resulting in the electrical components being closely positioned together within the casing often with little or no internal ventilation. The heat generating electrical components are placed into contact with the heat sink to dissipate the generated heat. In order to maximize the heat dissipation of the heat sink, it is important to maintain the direct physical contact of the power transistor or rectifier component against the heat sink material of the casing.

A conventional method of mounting the power transistor or rectifier components to the heat sink includes drilling a hole in the heat sink material and screwing down the component. Typically, this requires a physical extension of the component which is large enough to have a screw hole, and which is rigid enough to hold the body of the component against the heat sink when the screw fastens the component down. One difficulty with this arrangement involves matching the locations of the component screw hole and the hole of the heat sink, because the component is usually located at a fixed position on the circuit board. These complications can interfere with the quality of the connection of the component with the heat sink, can stress the electrical connections, as well as increasing the time needed to manufacture the unit.

Alternative methods of maintaining the thermal connectivity of the component and the heat sink involve screwing down a hold down bar or a clamp to hold the component in place, or forming a screw hole or channel in the power transistor or rectifier component so that the component may be directly screwed to the heat sink. These methods similarly have disadvantages in terms of material cost, manufacturing cost, and heat dissipation effectiveness. The additional cost of the screw and allocating manufacturing resources to providing the hole for the screw and the labor to install the screw increase the cost of the unit. Any loosening of the set screw will decrease the thermal connectivity of the component with the heat sink. Further, the location and placement of the screws must be carefully made so that other portions of the transformer or amplifier are not damaged.

Similar problems confront other types of electrical circuit devices. Computers, telecommunications equipment, medical imagining equipment, and other types of electronics include package semiconductors which generate heat during operation. Many varieties of clamping devices, some spring activated, are used in such circuitry to hold a semiconductor package in thermal contact with the heat sink. Typically, additional structural elements are needed on the semiconductor package or the circuit board to create the clamping effect. However, these required additional structural elements prevent such arrangements from being used with conventional semiconductor package or circuit board configurations.

What is needed is an effective method of maintaining the thermal connectivity of the heat generating component to the heat sink wall.

SUMMARY OF THE INVENTION

The present invention is a power converter module with a heat sink clip engaging a slot in the heat sink which requires the clip to exert pressure on a heat generating component thus maintaining the thermal connectivity between the heat generating components and the heat sink. The structure of the clip and heat sink simplifies the assembly of the electronic module and enhances the thermal connection between the heat generating components of the electronic module and the heat sink material.

The assembly of the electronic module of the present invention does not require the drilling of mounting holes. By integrally forming the slot as part of the heat sink, the heat sink requires no preparation for attaching to the heat sink clip. The heat sink clip has a generally L-shaped configuration, with the shorter portion of the "L" extending into the slot. An articulated portion extends from the corner of the "L" and projects down to engage and press the heat generating electrical component tightly onto or against the heat sink. The heat sink clip is self-aligning and avoids requiring any further materials to maintain the engagement of the heat generating component and the heat sink. Thus, in addition to simplifying assembly of the electronic module, the present invention minimizes material costs as well.

The shorter portion of the clip has a flared end portion that resiliently engages the slot forming an interference fit. The contour of the slot includes a lip which engages the corner of the heat sink clip and helps to retain the clip in the slot. The contour of the slot also includes an inclined surface which facilitates the entry of the shorter end into the slot. This structure provides a fairly secure engagement of the clip and heat sink, an engagement which may be manually created and manually disengaged as well. Also, this engagement resiliently biases the heat generating component into the heat sink to maintain heat dissipation.

The arrangement of the present invention provides advantages in terms of material cost, manufacturing time and expense, and product configuration. By only requiring a single additional piece, the present invention avoids the need for a screw or other additional structural element. The ability to manually install the clip greatly facilitates manufacturing time and reduces the labor cost as well. Finally, fewer constraints are imposed on the product configuration because of the structure of the present invention because unlike screws, which require a certain amount of access space, the engagement of the clip and slot requires minimal access space.

The present invention, in one form, involves a power converter module for a vehicle comprising a heat sink, circuitry, and a clip. The heat sink is disposed within the power converter module and includes a plurality of fins. The circuitry is disposed within the power converter module for power amplification or transformation, and includes at least one power component which generates heat during operation. The clip presses the power component into the heat sink, with one end of the clip engaging a slot of the module and the second end having a resilient biasing that presses the power component into thermal contact with the heat sink.

The slot includes a lip which retains the clip within the slot. The clip has a generally L-shaped configuration for engaging the slot, and is made of a metallic material. The clip includes a corner and the lip retains the corner within the slot. The clip also includes an end flange for engaging the slot in an interference fit, and the clip includes an articulated portion extending beyond the power component so that only the other end of the clip contacts the power component. A thermally conductive, electrically insulating layer may optionally be disposed between the power component and the heat sink. The slot includes a sloped surface which facilitates the entry of the clip.

BRIEF DESCRIPTION OF THE DRAWINGS

The above mentioned and other features and objects of this invention, and the manner of attaining them, will become more apparent and the invention itself will be better understood by reference to the following description of an embodiment of the invention taken in conjunction with the accompanying drawings, wherein:

FIG. 1 is a perspective view of the power module of the present invention.

FIG. 2 is a perspective view of the power module of FIG. 1 with the top cover removed.

FIG. 3 is a sectional view of a heat wall and clip taken along line 3—3 of FIG. 2.

FIG. 4 is a perspective view of the clip shown in FIG. 3.

FIG. 5 is an enlarged view of the circled section of FIG. 3.

Corresponding reference characters indicate corresponding parts throughout the several views. Although the drawings represent embodiments of the present invention, the drawings are not necessarily to scale and certain features may be exaggerated in order to better illustrate and explain the present invention. The exemplification set out herein illustrates an embodiment of the invention, in one form, and such exemplifications are not to be construed as limiting the scope of the invention in any manner.

DESCRIPTION OF THE PRESENT INVENTION

The embodiment disclosed below is not intended to be exhaustive or limit the invention to the precise form disclosed in the following detailed description. While the exemplary embodiment deals with a power converter module for an automobile or other vehicle, the principals of the invention may be applied to a variety of electronic modules. Rather, the embodiment is chosen and described so that others skilled in the art may utilize the teachings of the invention.

Power converter module 20 is shown in FIG. 1, and is generally of the type used in vehicles such as automobiles, recreational vehicles, trucks, and boats. Such power converter modules may perform electrical power transformation or amplification. Typically, such power converter modules are disposed in relatively confined locations in the vehicle. Casing 22 includes heat sinks 24, each of which include a plurality of fins 26 which assist in the dissipation of heat created during operation of power converter 20. Power converter module 20 may optionally include fan 28 for ventilating the interior of casing 22, and plugs 30 for connecting to other components of the vehicle, such as the alternator or battery. In the context of this application, the term "power converter module" is intended to include transformer, amplifier, and other similar circuits. In addition, the invention may also be applied to other electronic modules, so in the context of this application, the term "electronic module" is intended to cover any electronic application, including but not limited to power converters, power inverters, power amplifiers, sound amplifiers, medical magnetic resonance imaging devices, computers, telecommunications equipment, and the like.

The interior of power converter module 20 is shown in perspective in FIG. 2. By omitting casing 22, power converter circuitry 30 is visible. Conventional in design, power converter circuitry 30 includes certain components involved in the power conversion which generate heat during operation. Power converter circuitry 32 is of conventional design including several components mounted to circuit board 34, which includes at least one heat generating component, represented by numeral 36 which may be a power transistor, diode, or rectifier, such as in a TO-220 or TO-247 type semiconductor package. However, heat generating component 36 may be of virtually any size or shape and be adapted for use in the present invention. Heat sinks 24 are also conventionally configured, having a substantial heat conducting body and a plurality of outwardly extending fins 26. Heat generating components 36 are disposed on circuit board 34 adjacent heat sinks 24 to facilitate thermal connection.

In accordance with the present invention, heat generating components 36 are pressed in thermal contact with heat sink 24 by the engagement of clip 38 with slot 40 of heat sink 24. As shown in FIG. 3, sil pad or laminate 42 may be disposed between heat sink 24 and heat generating component 36 to provide a dielectric barrier, while still allowing heat transfer from component 36 to heat sink 24. The use of laminate 42 is optional, and is not needed with low voltage applications, isolated components, or arrangements which use the heat sink as the bus bar. End 46 of clip 38 starts at corner 44 and extends into slot 40 with a flared portion. Articulated portion 48 then extends from corner 44 out from component 36, so that end 50 of clip 38 is biased into component 36 and presses component into optional laminate 42 and thus into thermal contact with heat sink 24. End 50 is also flared outwardly, so that its contact with component 36 is essentially linear.

FIG. 4 shows in detail the general L-shaped structure of clip 38, while FIG. 5 shows in detail the engagement of clip 38 with slot 40 which allows for the secure engagement which is also manually removable. To facilitate the entry and engagement of end 46 into slot 40, heat sink 24 includes inclined surface 52 as the lower definition of slot 40. The flared portion of end 46 forms a generally linear contact area with inclined surface 52 to minimize frictional resistance to movement of end 46. Once extended into slot 40, corner 44 engages lip 54 formed in the upper definition of slot 40 in heat sink 24. Thus, once end 46 is completely disposed within slot 40, lip 54 inhibits the movement of clip end 46 out of slot 40. However, the resilient material of clip 38 allows for a manually applied force to overcome this resistance and allow the manual removal of clip 38 from slot 40, although such removal may be facilitated by the use of a screwdriver or the like to pry clip 38 away from heat sink 24.

Clip 38 may be formed from a hard, resilient material which in the exemplary embodiment includes spring steel, but may also be any of equivalent metallic material having a spring biasing such as beryllium copper, bronze, or other spring alloy metal materials. The thickness of the material of clip 38 is in the range of about 0.030 to 0.040 inches, while slot 40 is about 0.074 inches thick. This material is conventionally initially fabricated as sheet stock material, which is then cut and bent according to the structure shown in FIG. 4 and then heat treated for tempering, and finally coated for rust-proofing and lubricity. In the exemplary embodiment, the flared portions on ends 46 and 50 are flared at an angle in the range of 25 to 35 degrees. Corner 44 is bent at an angle in the range of 85 to 95 degrees. Articulated portion 48 has a bent in its middle in the range of 20 to 30 degrees.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. An electronic module comprising:

a heat sink disposed in said electronic module, said heat sink having a contact surface and a slot located above said contact surface;

circuitry disposed within said electronic module, said circuitry including at least one heat generating power component which generates heat during operation, said at least one heat generating power component disposed proximate said contact surface and below said slot; and a clip pressing said heat generating power component into said heat sink, said clip having first end engaging said slot, said clip having a second end extending from said first end; said second end having a resilient biasing that presses said heat generating power component into thermal contact with said heat sink contact surface, said clip having a corner connecting said first end and said second end;

said first end and said slot being structured and arranged to allow said first end to extend and slide into said slot, said slot having a lip which extends proximate an opening of said slot, said first end having a length which allows said corner to abut said lip and inhibit movement of said first end out of said slot whereby said clip engages said slot and said lip retains said first end within said slot.

2. The electronic module of claim 1 wherein said clip has a generally L-shaped configuration for engaging said slot.

3. The electronic module of claim 1 wherein said clip includes a flared portion for engaging said slot in an interference fit.

4. The electronic module of claim 1 further comprising a thermally conductive, electrically insulating layer disposed between said power component and said heat sink.

5. The electronic module of claim 1 wherein said clip includes an articulated portion between said first and second ends, said articulated portion extending beyond said power component so that only said second end contacts said power component.

6. The electronic module of claim 1 wherein said clip is made of a metallic material having spring biasing properties.

7. The electronic module of claim 1 wherein said slot includes a sloped surface which facilitates the entry of said clip.

8. An electronic module for a vehicle comprising:

a casing having at least one heat sink with a plurality of fins, said heat sink defining a wall, said wall having a contact surface and a slot located in said wall and above said contact surface;

power converter circuitry disposed within said casing, said power converter circuitry including at least one power component which produces heat as a result of operation, said at least one power component disposed proximate said contact surface and below said slot; and means for clamping said power component into said wall contact surface of said heat sink, said clamping means engaging said slot and pressing said power component into thermal contact with said heat sink wall contact surface;

said clamping means and said slot being structured and arranged to allow an engaging portion of said clamping means to extend and slide into said slot, said slot having a lip which extends proximate an opening of said slot, said engaging portion having a length which extends to an abutment portion and which allows said abutment portion to abut said lip and inhibit movement of said engaging portion out of said slot whereby said clamping means engages said slot and said lip retains said engaging portion within said slot.

9. The electronic module of claim 8 wherein said clamping means includes a generally L-shaped body with a engaging portion of said L-shaped body engaging said slot.

10. The electronic module of claim 9 wherein said L-shaped body includes an articulated portion distinct from said engaging portion, said articulated portion extending outside said slot and beyond said power component so that only one end of said L-shaped body contacts said power component.

11. The electronic module of claim 9 wherein said L-shaped body includes a corner and said slot of said casing includes a lip which retains said corner within said slot.

12. The electronic module of claim 11 wherein said clamping means includes a body having a flared portion for engaging said slot in an interference fit.

13. The electronic module of claim 8 further comprising a thermally conductive, electrically insulating layer disposed between said power component and said heat sink.

14. The electronic module of claim 8 wherein said clamping means is made of a metallic material.

15. The electronic module of claim 8 wherein said slot includes a sloped surface which facilitates the entry of said clamping means.

16. A power converter module for a vehicle comprising:

a casing, said casing including a heat sink including a plurality of fins, said heat sink defining a wall, said wall having a contact surface and a slot located in said wall above said contact surface, circuitry disposed within said casing, said circuitry capable of performing power amplification or transformation, said circuitry including at least one heat generating component which generates heat during operation, said at least one heat generating component disposed proximate said contact surface and below said slot; and clamping means for clamping said heat generating component into said wall contact surface of said heat sink, said clamping means engaging said slot and pressing said heat generating component into thermal contact with said heat sink wall contact surface;

said clamping means and said slot being structured and arranged to allow an engaging portion of said clamping means to extend and slide into said slot, said slot having a lip which extends proximate an opening of said slot, said engaging portion having a length which extends to an abutment portion and which allows said abutment portion to abut said lip and inhibit movement of said engaging portion out of said slot whereby said clamping means engages said slot and said lip retains said engaging portion within said slot.

17. The power converter module of claim 16 wherein said clamping means includes a clip, said clip having a first end engaging a slot of said module, said clip having a second end extending from said first end; said second end having a resilient biasing that presses said power component into thermal contact with said heat sink.

18. A method of installing a heat sink clip to press an electrical component into a heat dissipating device, comprising the steps of:

providing a heat sink with a contact surface and a slot located above the contact surface, the slot having a lip which extends proximate an opening of the slot;

providing a clip with a first end adapted to engage the slot, a second end extending from the first end with a resilient biasing that is adapted to press the electrical component into thermal contact with the heat sink contact surface, and a corner connecting the first and second ends;

inserting the first end into the slot;

pressing the first end until the corner abuts the lip and inhibits movement of the first end out of the slot whereby the clip engages the slot and the lip retains the first end within the slot.

* * * * *